US006803608B1

United States Patent
Chen

(10) Patent No.: US 6,803,608 B1
(45) Date of Patent: Oct. 12, 2004

(54) LIGHT EMITTING DIODE USED AS AN ILLUMINANT OF AN IMAGE SENSOR

(76) Inventor: Wen-Ching Chen, P.O. Box 2103, Taichung (TW)

( * ) Notice: Subject to any disclaimer, the term of this patent is extended or adjusted under 35 U.S.C. 154(b) by 0 days.

(21) Appl. No.: 10/457,317

(22) Filed: Jun. 10, 2003

(51) Int. Cl.⁷ .............................................. H01L 29/22
(52) U.S. Cl. ........................ 257/99; 257/81; 345/163; 345/166
(58) Field of Search ...................... 257/81, 99; 345/163, 345/166; 362/800

(56) References Cited

U.S. PATENT DOCUMENTS 5,175,783 A * 12/1992 Tatoh ........................... 385/93
5,893,633 A * 4/1999 Uchio et al. ................. 362/244
6,147,367 A * 11/2000 Yang et al. .................... 257/88
2003/0076035 A1 * 4/2003 Ueda ........................... 313/512

FOREIGN PATENT DOCUMENTS

JP          11161196 A  *  6/1999   ............. G09F/9/33

* cited by examiner

*Primary Examiner*—Amir Zarabian
*Assistant Examiner*—Christy Novacek

(57) ABSTRACT

An LED is used as an illuminant of an image sensor and includes a fabricated block, a first electrode and a second electrode contained in the fabricated block for transmitting an electric current to a PN surface of a semiconductor that is contained in the fabricated block and secured in a top portion of the first electrode. The semiconductor has a light-projecting axis forming an acute angle with an elongate line of a bottom of the fabricated block.

1 Claim, 4 Drawing Sheets

LIGHT EMITTING DIODE USED AS AN ILLUMINANT OF AN IMAGE SENSOR

BACKGROUND OF THE INVENTION

1. Field of the Invention

The present invention relates to a light emitting diode (LED), and more particularly to an LED that is used as an illuminant of an image sensor.

2. Description of Related Art

The digital image technology has been widely applied for judging and calculating a displacement of a moving object. For an accurate judging and calculating, an illuminant is necessary to the image sensor.

For example, an optical mouse (7) uses the digital image technology to calculate the displacement thereof. The optical mouse (7) comprises a circuit board (71) mounted therein and a complementary metal oxide semiconductor (CMOS) image-sensing module (73) secured on the circuit board (71). A sensing chip (74) is fabricated in the CMOS image-sensing module (73). An LED (8) is mounted on a rear end of the circuit board (71) and a lens (9) mounted on the circuit board (71). The LED (8) is used as an illuminant for the CMOS image-sensing module (73). The lens (9) includes a convex (91) formed near a middle portion of the lens (9) under the circuit board (71), and a prism (92) formed on a rear end of the lend (9) and facing the LED (8).

The sensing chip (74) has an image collecting area via the convex (91) and the light ray from the LED (8) projects on the image collecting area of the sensing chip (74) after a total reflection effect of the prism for providing an illuminant to the sensing chip (74). Consequently, the sensing chip (74) can collecting and transmitting the difference of the sensing surface in a high frequency for calculating the displacement of the optical mouse (7) when the optical mouse (7) is moved.

The lens (9) in mounted under the circuit board (71) and the LED (8) must be arranged to correspond to the prism (92). Consequently, the volume of optical mouse (7) is hard to be reduced and the lens (9) may raise the manufacturing cost of the optical mouse (7).

With reference to FIG. 9, the prism (92) includes a first reflective surface (921) and a second reflective surface (922) for total reflecting the light from the LED (8) to the image collecting area of the sensing chip (74). However, the illumination of light ray is gradually reduced due to an elongated route and the low illumination will cause a bad influence to the accuracy of the sensing chip (74). Consequently, the manufacturer has no choice but to use an LED that has a high illumination to promote the accuracy of the sensing chip (74). However, the high illumination LED usually consumes a high electric power. Consequently, the high illumination LED is unsuitable to a wireless optical mouse that value to power-saving.

The present invention has arisen to mitigate and/or obviate the disadvantages of the conventional LED that is used as an illuminant of an image sensor.

SUMMARY OF THE INVENTION

The main objective of the present invention is to provide an improved LED that is used as an illuminant of an image sensor.

To achieve the objective, the LED in accordance with the present invention comprises a fabricated block, a first electrode and a second electrode contained in the fabricated block for transmitting an electric current to a PN surface of a semiconductor that is contained in the fabricated block and secured in a top portion of the first electrode. The semiconductor has a light-projecting axis forming an acute angle with an elongate line of a bottom of the fabricated block.

Further benefits and advantages of the present invention will become apparent after a careful reading of the detailed description with appropriate reference to the accompanying drawings.

DETAILED DESCRIPTION OF THE INVENTION

Figure 1:
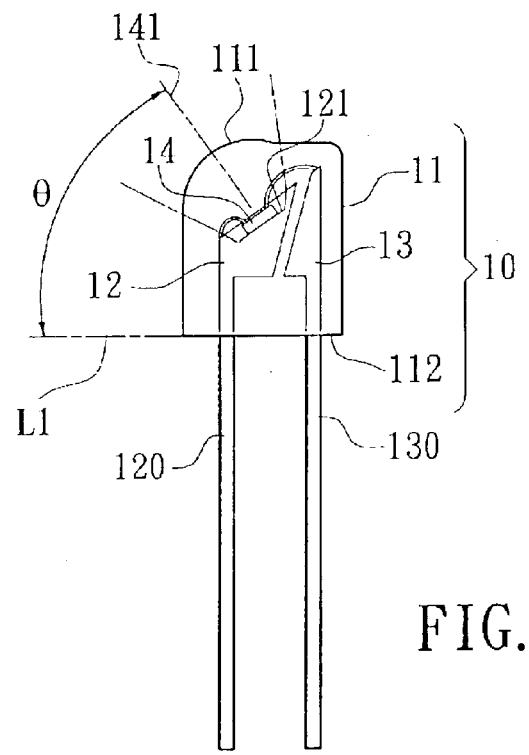
FIG. 1 is a side plan view of a first embodiment of an LED used as an illuminant of an image sensor in accordance with the present invention.

Referring to the drawings and initially to FIG. 1, a light emitting diode (LED) in accordance with the present invention comprises a fabricated block (11), a first electrode (12) and a second electrode (13) contained in the fabricated block (11) for transmitting an electric current to a PN surface of a semiconductor (14) that is contained in the fabricated block (11) and secured in a top portion of the first electrode (12). A recess (121) is defined in the top portion of the first electrode (12) and the semiconductor (14) is secured in the recess (121). The recess (121) is inclined relative to an axis of the second electrode (13). The first electrode (12) includes a first lead (120) extending therefrom and perpendicularly penetrating through a flat bottom (112) of the fabricated block (11). The second electrode (13) includes a second lead (130) extending therefrom and perpendicularly penetrating through the flat bottom (112) of the fabricated block (11). A convex (111) is formed on an outer periphery of the fabricated block (11) and has an axis along a light-projecting axis (141) of the semiconductor (14). The light-projecting axis (141) forms an acute angle (θ) with an elongate line (L1) of the flat bottom of the fabricated block (11). In the preferred embodiment of the present invention, the acute angle (θ) is set between 15 degrees and 85 degrees.

Figure 2:
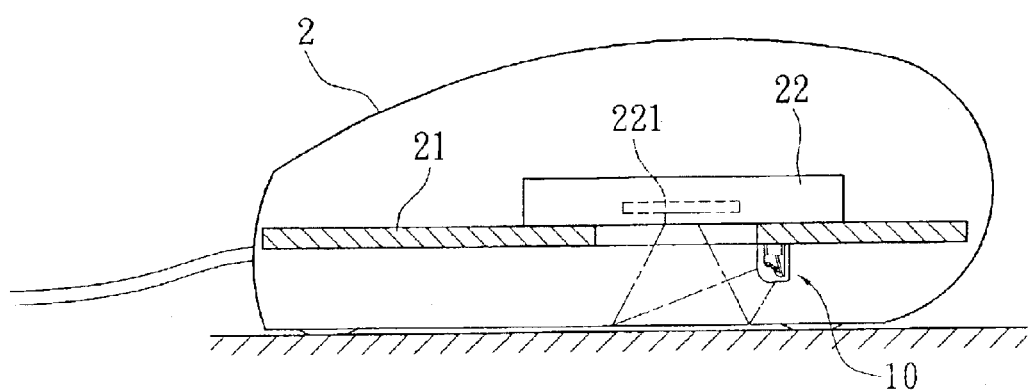
FIG. 2 is a schematic side plan view of the LED in FIG. 1.

With reference to FIG. 2, the LED in accordance with the present invention is adapted to be mounted on a first side of a circuit board (21) of an optical mouse (2) and the flat bottom (112) of the LED abutting the first side of the circuit board (21). The circuit board (21) comprises a CMOS image-sensing module (22) secured on a second side of the circuit board (21) and containing a sensing chip (221) fabricated in the CMOS image-sensing module (22). The light ray from the LED directly projects on an image collecting area of the sensing chip (221) after penetrating the convex (111) and is used as an illuminant for the sensing chip (221) to accurately judge and calculating a displacement of the optical mouse (2).

Thus, the lens of the optical mouse is unnecessary and the loss of the light ray from the LED is reduced to achieve the objectives of reducing manufacturing cost and power-saving when the LED in accordance with the present invention is provided to an optical mouse. Furthermore, the LED is mounted close to the sensing chip (221) such that the volume of the optical can be deduced.

Figure 3:
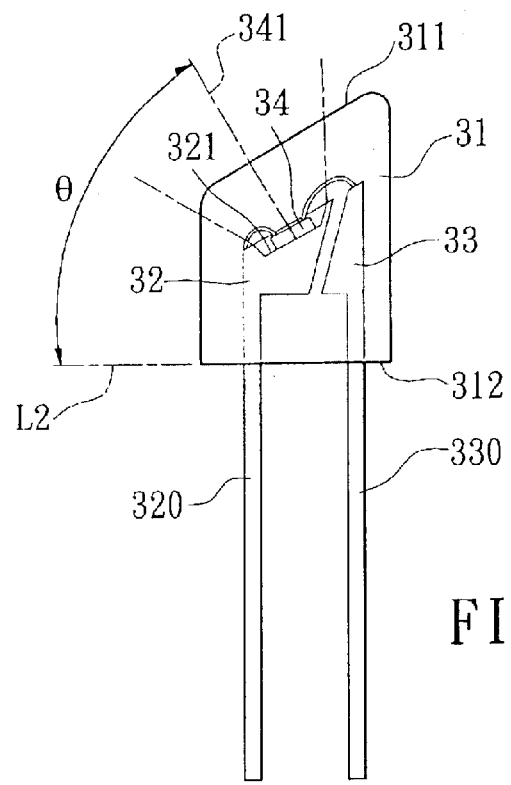
FIG. 3 is a is a side plan view of a second embodiment of an LED used as an illuminant of an image sensor in accordance with the present invention.

With reference to FIG. 3, the second embodiment of the LED in accordance with the present invention comprises a fabricated block (31), a first electrode (32) and a second electrode (33) contained in the fabricated block (31) for transmitting an electric current to a PN surface of a semiconductor (34) that is contained in the fabricated block (31) and secured in a top portion of the first electrode (32). A recess (321) is defined in the top portion of the first electrode (32) and the semiconductor (34) is secured in the recess (321). The recess (321) is inclined relative to an axis of the second electrode (33). The first electrode (32) includes a first lead (320) extending therefrom and perpendicularly penetrating through a flat bottom (312) of the fabricated block (31). The second electrode (33) includes a second lead (330) extending therefrom and perpendicularly penetrating through the flat bottom (312) of the fabricated block (31). The fabricated block (31) has an plane mirror (311) formed on a top thereof and parallel to the semiconductor (34) that has a light-projecting axis (341) forms an acute angle (θ) with an elongate line (L2) of the flat bottom (312) of the fabricated block (11). In the preferred embodiment of the present invention, the acute angle (θ) is set between 15 degrees and 85 degrees.

Figure 4:
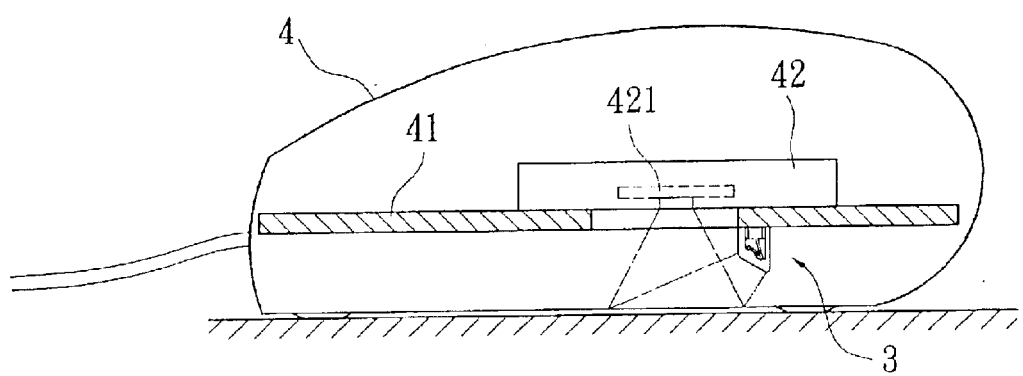
FIG. 4 is a schematic side plan view of the LED in FIG. 3.

With reference to FIG. 4, the LED in accordance with the present invention is adapted to be mounted on a first side of a circuit board (41) of an optical mouse (4) and the flat bottom (312) of the LED abutting the first side of the circuit board (41). The circuit board (41) comprises a CMOS image-sensing module (42) secured on a second side of the circuit board (41) and containing a sensing chip (421) fabricated in the CMOS image-sensing module (42). The light ray from the LED directly projects on an image collecting area of the sensing chip (421) after penetrating the plane mirror (311) of the fabricated block (31) and is used as an illuminant for the sensing chip (421) to accurately judge and calculating a displacement of the optical mouse (4).

Thus, the lens of the optical mouse is unnecessary and the loss of the light ray from the LED is reduced to achieve the objectives of reducing manufacturing cost and power-saving when the LED in accordance with the present invention is provided to an optical mouse. Furthermore, the LED is mounted close to the sensing chip (421) such that the volume of the optical can be deduced.

Figure 5:
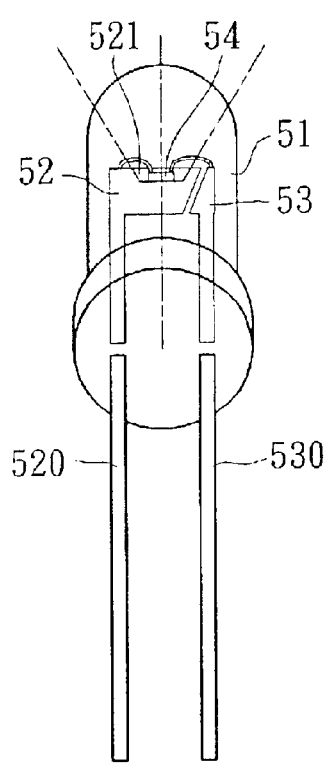
FIG. 5 is a front plan view of a third embodiment of an LED used as an illuminant of an image sensor in accordance with the present invention.
Figure 6:
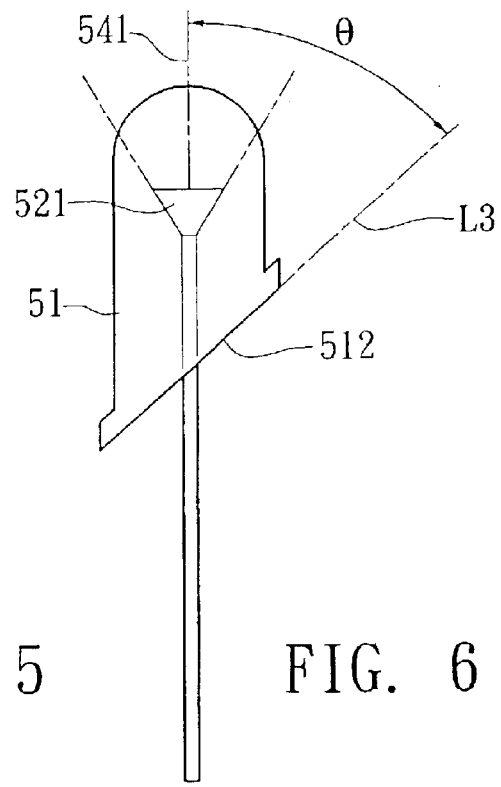
FIG. 6 is a side plan view of the LED in FIG. 5.

With reference to FIGS. 5 and 6, the third embodiment of the LED in accordance with the present invention comprises a fabricated block (51), a first electrode (52) and a second electrode (53) contained in the fabricated block (51) for transmitting an electric current to a PN surface of a semiconductor (54) that is contained in the fabricated block (51) and secured in a top portion of the first electrode (52). A recess (521) is defined in the top portion of the first electrode (52) and the semiconductor (54) is secured in the recess (521). The recess (521) is laterally and perpendicularly relative to an axis of the second electrode (53). The first electrode (52) includes a first lead (520) extending therefrom and perpendicularly penetrating through a slanting bottom (512) of the fabricated block (51). The second electrode (53) includes a second lead (530) extending therefrom and perpendicularly penetrating through the slanting bottom (512) of the fabricated block (51). The semiconductor (54) has a light-projecting axis (541) parallel to an axis of the first lead (520)/second lead (530) and forming an acute angle (θ) with an elongate line (L3) of the slanting bottom (512) of the fabricated block (51). In the preferred embodiment of the present invention, the acute angle (θ) is set between 15 degrees and 85 degrees.

Figure 7:
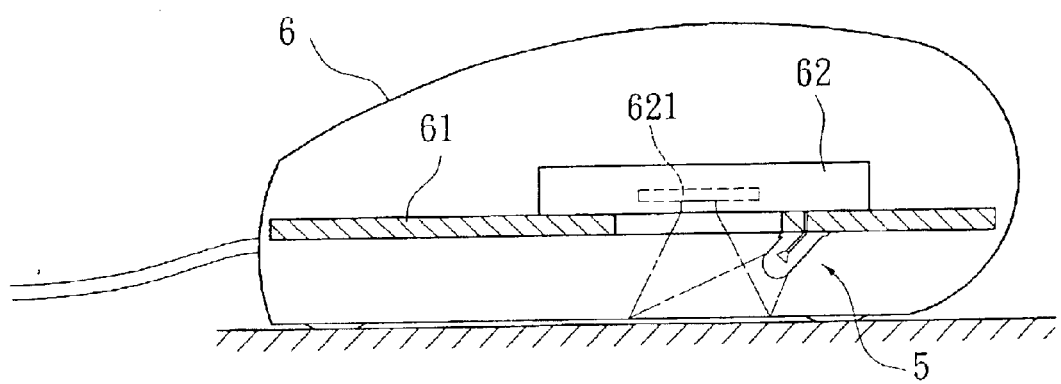
FIG. 7 is a schematic side plan view of the LED in FIG. 5.
Figure 8:
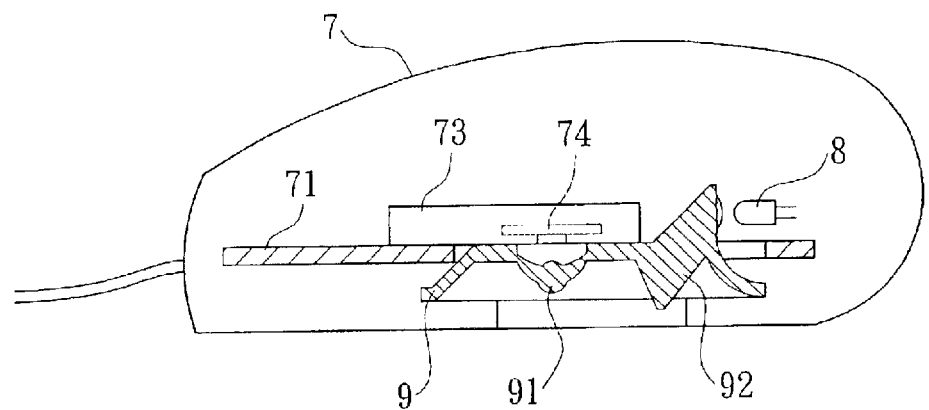
FIG. 8 is a schematic plan view of an optical mouse that includes a convention LED used as an illuminant of the optical mouse.
Figure 9:
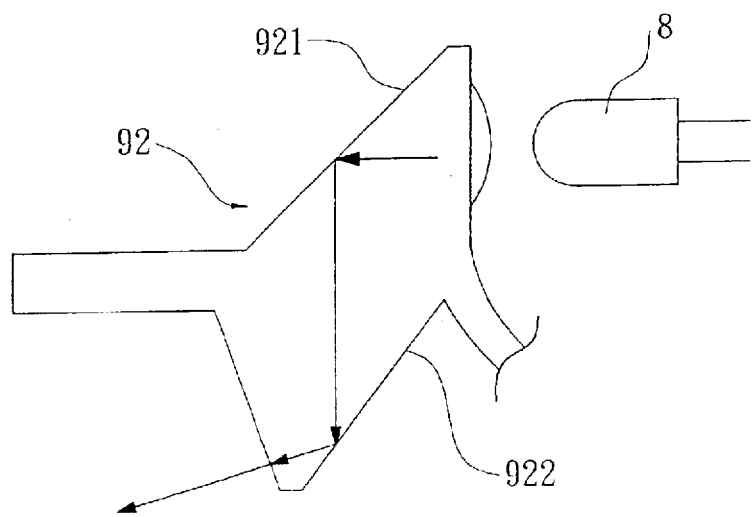
FIG. 9 is a side plan view for showing the structure of the prism and the LED in FIG. 8.

With reference to FIG. 7, the LED in accordance with the present invention is adapted to be mounted on a first side of a circuit board (61) of an optical mouse (6) and the slanting bottom (512) of the LED abutting the first side of the circuit board (61). The circuit board (61) comprises a CMOS image-sensing module (62) secured on a second side of the circuit board (61) and containing a sensing chip (621) fabricated in the CMOS image-sensing module (62). The light ray from the LED directly projects on an image collecting area of the sensing chip (621) after penetrating the top of the fabricated block (51) and is used as an illuminant for the sensing chip (621) to accurately judge and calculating a displacement of the optical mouse (6).

Thus, the lens of the optical mouse is unnecessary and the loss of the light ray from the LED is reduced to achieve the objectives of reducing manufacturing cost and power-saving when the LED in accordance with the present invention is provided to an optical mouse. Furthermore, the LED is mounted close to the sensing chip (621) such that the volume of the optical can be deduced.

Although the invention has been explained in relation to its preferred embodiment, it is to be understood that many other possible modifications and variations can be made without departing from the spirit and scope of the invention as hereinafter claimed.

What is claimed is:

1. A light emitting diode (LED) used as an illuminant of an image sensor, comprising a fabricated block, a first electrode and a second electrode contained in the fabricated block for transmitting an electric current to a PN surface of a semiconductor that is contained in the fabricated block and secured in a top portion of the first electrode, the semiconductor having a light-projecting axis forming an acute angle with an elongate line of a bottom of the fabricated block;

wherein the first electrode comprises a recess defined in a top thereof, the semiconductor is secured in the recess, and the angle formed by the light-projecting axis of the semiconductor and the elongate line of a bottom of the fabricated block is set between 15 degrees and 85 degrees;

wherein the recess is inclined relative to an axis of the second electrode, including a first lead extending therefrom and perpendicularly penetrating through a flat bottom of the fabricated block, the second electrode including a second lead extending therefrom and perpendicularly penetrating through the flat bottom of the fabricated block, the fabricated block having an plane mirror formed on a top thereof and parallel the semiconductor.

* * * * *